US008432192B2

(12) United States Patent
Guyton et al.

(10) Patent No.: US 8,432,192 B2
(45) Date of Patent: Apr. 30, 2013

(54) 2-PHASE THRESHOLD DETECTOR BASED CIRCUITS

(75) Inventors: Matthew Guyton, Arlington, MA (US); Hae-Seung Lee, Lexington, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 88 days.

(21) Appl. No.: 13/112,275

(22) Filed: May 20, 2011

(65) Prior Publication Data

US 2012/0293232 A1    Nov. 22, 2012

(51) Int. Cl.
*H03K 5/22*    (2006.01)

(52) U.S. Cl.
USPC ............................... 327/37; 327/78; 327/94

(58) Field of Classification Search ............... 327/77–80, 327/37, 91, 94
See application file for complete search history.

(56) References Cited

U.S. PATENT DOCUMENTS

| | | | |
|---|---|---|---|
| 7,242,331 B1 * | 7/2007 | Lin ............................... | 341/118 |
| 7,319,425 B2 | 1/2008 | Fiorenza et al. | |
| 7,459,942 B2 | 12/2008 | Lee | |
| 7,486,115 B2 | 2/2009 | Lee | |
| 7,522,086 B2 * | 4/2009 | Lee ............................... | 341/172 |
| 2011/0169348 A1 * | 7/2011 | Park ................................ | 310/15 |

OTHER PUBLICATIONS

Robert Gregoire and Un-Ku Moon, "An Over-60 dB True Rail-to-Rail Performance Using Correlated Level Shifting and an Opamp With Only 30 dB Loop Gain," in IEEE Journal of Solid-State Circuits, vol. SC-43, No. 12, pp. 2630-2630, Dec. 2008.
Lane Brooks and Hae-Seung Lee, "A 12b 50MS/s Fully Differential Zero-Crossing-Based ADC Without CMFB," in Digest of Technical Papers, IEEE International Solid-State Circuits Conference, pp. 166-167, San Francisco, CA, Feb. 2009.
Benjamin P Hershberg, Skyler T Weaver, and Un-Ku Moon, "A 1.4V Signal Swing Hybrid CLS-Opamp/ZCBC Pipelined ADC Using a 300mV Output Swing Opamp,"in Digest of Technical Papers, IEEE International Solid-State Circuits Conference, pp. 302-303, San Francisco, CA, Feb. 2010.
Hariprasath Venkatram, Ben Hershberg and Un-Ku Moon, "Asynchronous CLS for Zero Crossing based Circuits," proceedings of IEEE International Conference on Electronics, Circuits, and Systems, pp. 1025-1028, Dec. 2010.
Matthew Guyton, "A Low-Voltage Zero-Crossing-Based Delta-Sigma Analog-to-Digital Converter," Ph.D. Thesis, Massachusetts Institute of Technology, submitted on May 21, 2010 (publication date: Nov. 12, 2010).

* cited by examiner

*Primary Examiner* — Dinh T. Le
(74) *Attorney, Agent, or Firm* — North Weber & Baugh LLP

(57) ABSTRACT

A switched capacitor circuit includes a threshold detector to generate a threshold detection signal when a difference between first and second input signals crosses a predetermined level. A coarse current source produces a coarse ramp. A series sampling capacitor samples a coarse output voltage when the threshold detector indicates a first threshold crossing. The sampling capacitor is connected in series with a fine current source producing a fine ramp.

16 Claims, 5 Drawing Sheets

2-PHASE THRESHOLD DETECTOR BASED CIRCUITS

FIELD OF THE PRESENT INVENTION

The present invention relates generally to switched capacitor circuits, analog-to-digital converters, and delta-sigma modulators. More particularly, the present invention relates to two-or multi-phase threshold detector based switched-capacitor circuits to achieve higher accuracy.

BACKGROUND OF THE PRESENT INVENTION

Switched-capacitor circuits based on threshold detectors such as a comparator and a zero-crossing detector can operate at high speeds at more than an order of magnitude lower power consumption than traditional circuits. The primary source of inaccuracy in threshold detector based circuits is the output voltage overshoot that results from the finite delay of the threshold detector. The amount of the output overshoot is the ramp rate multiplied by the delay of the threshold detector. In high speed circuits, the ramp rate must be very high. For example, in 200 MS/s pipeline analog-to-digital converters, each half clock phase is only about 2 ns if non-overlapping clock requirements are included. Subtracting the preset time necessary for the operation of the threshold detector based circuits, approximately 1.5 ns remains. In a single phase threshold detector based circuits, the ramp must traverse the full scale of about 1V in 1.5 ns, giving a ramp rate of 0.66V/ns. At this high ramp rate, a typical 200 ps delay of the threshold detector results in 133 mV output overshoot.

With enough over-range and digital error-correction capability, even such a large overshoot only translates to constant input referred offset. In practice, however, the variation of the overshoot is the problem. The ramp rate and the delay may change with process and temperature, causing a process and temperature dependent overshoot. More troublesome is the overshoot variation with the output signal. The ramp is not perfectly linear due to the finite output resistance of the current source and nonlinear parasitic capacitance. Therefore, the ramp rate is typically a function of the output voltage. The overshoot, as a consequence, is also a function of the output voltage. This signal dependent overshoot gives similar effects to finite gain in op-amp based circuits, hence causes nonlinearity in the resulting circuit characteristic. In analog-to-digital converters, for example, differential nonlinearity (DNL) and integral nonlinearity (INL) result.

In order to reduce the overshoot and resulting nonlinearity, the basic principle of a two phase ramp technique was demonstrated in prior art. The prior art 2-phase ramp circuit is illustrated in FIG. 1, where the charge-transfer phase of a typical switched-capacitor circuits is shown. The capacitors 34 and 35 typically sample the input voltage in the preceding sampling phase. The capacitor 41 is the sampling capacitor of the next stage, for example, of a pipeline A/D converter. Two current sources, 11 and 12 produce the coarse and the fine ramps, respectively. During the coarse phase, the coarse current source 11 is enabled and charges the capacitor network consisting of capacitors 34, 35, and 41. The value of the current source 11 is chosen such that a fast up-ramp is obtained. Typically, the time allowed for the coarse phase is less than 50% of the half clock phase. When the threshold detector trips, the current source 11 is disabled. The coarse phase overshoot $V_{OS1}$, as shown in FIG. 2, is the product between the coarse phase ramp rate and the delay $t_{d1}$ of the threshold detector 20. Due to the high rate of the ramp, the coarse phase overshoot, $V_{OS1}$ shown in FIG. 2, can be large.

The fine phase reduces the overshoot substantially. Immediately after the coarse phase, the fine current source 12 is enabled. When threshold crossing is detected during the fine phase, the sampling switch 30 is turned off, locking the sampled charge on the next stage capacitor 41.

The fine phase ramp can be made much slower than the first phase ramp because it only traverses the amount of the coarse phase overshoot rather than the full scale. The fine phase ramp rate can be further reduced by correcting for the coarse phase overshoot as shown in FIG. 3. Since the coarse phase overshoot $V_{OS1}$ is largely constant, it can be corrected by shifting threshold of the threshold detector 20 down by the input referred overshoot $V_{OC}$. In the prior art, this is accomplished by switching the reference input of the threshold detector to 20 $V_{OC}$ during the coarse phase by turning ON the switch 31 in FIG. 1 and turning OFF the switch 32 in FIG. 1, and returning the voltage to the common-mode voltage $V_{CM}$ during the fine phase by turning ON the switch 32 and turning OFF the switch 31. If $V_{OC}-V_{CM}=V_{OS1}$, the coarse phase overshoot will be zero. In practice, a small amount of overshoot must be allowed during the coarse phase to ensure the ramp crosses the threshold voltage of the threshold detector 20 in the presence of the variation in the overshoot. This is accomplished by making $V_{OC}-V_{CM}$ slightly smaller than $V_{OS1}$. Since the remaining coarse phase overshoot is much smaller, the fine phase ramp can be made substantially slower, for example by an order of magnitude, than that of the coarse phase. As a consequence, for given delay of the threshold detector, the final output overshoot $V_{OS2}$ is greatly reduced. This not only improves the input referred offset, but also improves the linearity between the input and output voltages of the circuit. In addition, the threshold detector input is better balanced during the threshold crossing detection, thus the power supply rejection is greatly improved. Although the input of the threshold detector is unbalanced during the coarse phase threshold detection, it poses no problem because any noise or error introduced during the coarse phase is removed during the fine phase.

SUMMARY OF THE PRESENT INVENTION

One aspect of the present invention is a switched-capacitor circuit based on two- or multi-phase threshold detection.

Another aspect the present invention is sampling of the coarse phase output on capacitor and put it in series with the fine current in a two- or multi-phase threshold detector based circuits.

Another aspect the present invention is removing the effect of finite output resistance of the fine current source.

Another aspect of the present invention is sampling of a coarse phase output on capacitors and put them in series with the fine currents in a differential two- or multi-phase threshold detector based circuits.

Another aspect the present invention is removing the effect of finite output resistance of the fine current sources in a differential two- or multi-phase threshold detector based circuits.

BRIEF DESCRIPTION OF THE DRAWINGS

The present invention may take form in various components and arrangements of components. The drawings are only for purposes of illustrating a preferred embodiment and are not to be construed as limiting the present invention, wherein.

DETAILED DESCRIPTION OF THE PRESENT INVENTION

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

Figure 1:
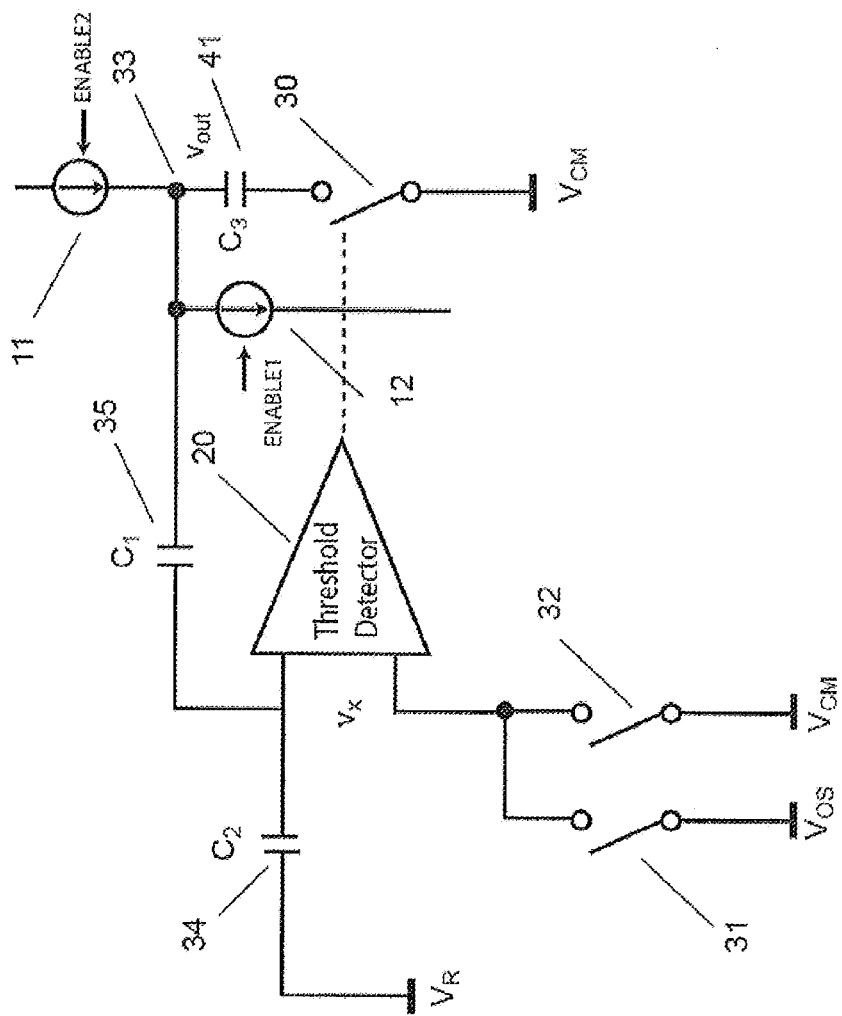
FIG. 1 illustrates a prior art 2-phase threshold detector based circuit.
Figure 2:
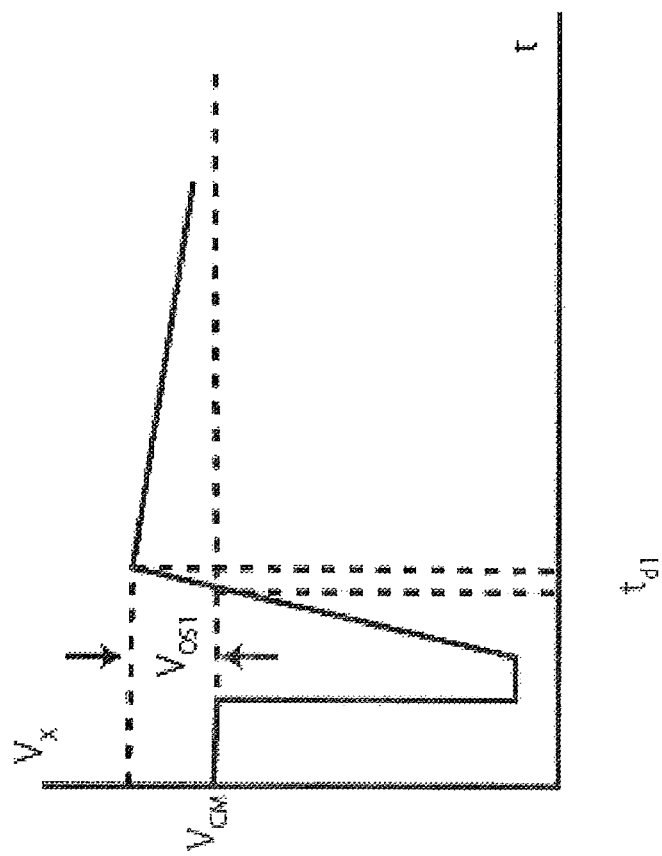
FIG. 2 illustrates output waveform of prior art 2-phase threshold detector based circuit.
Figure 3:
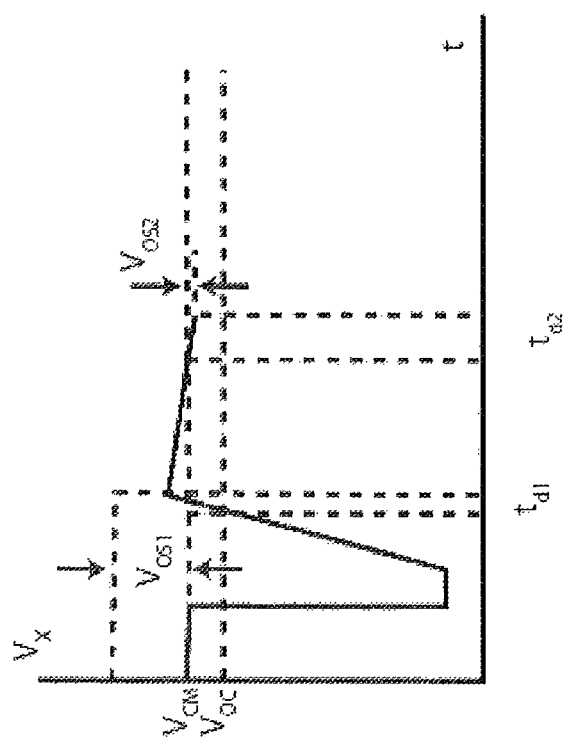
FIG. 3 illustrates output waveform of prior art 2-phase threshold detector based circuit with overshoot correction.

The prior art 2-phase circuit reduces the final output voltage overshoot and improves the accuracy. However, the variation of the overshoot due to the ramp nonlinearity, although reduced, still remains and poses limitations in high accuracy circuits. The nonlinearity of the ramp is primarily caused by the finite output resistance of the fine current source 12 in FIG. 2. The ramp rate is determined by the current I from the current source 12 and the total capacitance at node 33. As the output voltage at node 33 varies, the voltage across the current source 12 varies, and the finite output resistance of the current source 12 causes the current to vary. This causes the fine phase overshoot to vary as a function of the output voltage giving rise to nonlinearity. The present invention significantly reduces the voltage variation across the current source, thus maintaining the ramp rate to be substantially constant over a wide range of the output voltage. As a result, the accuracy of the resulting circuit is greatly improved.

Figure 4:
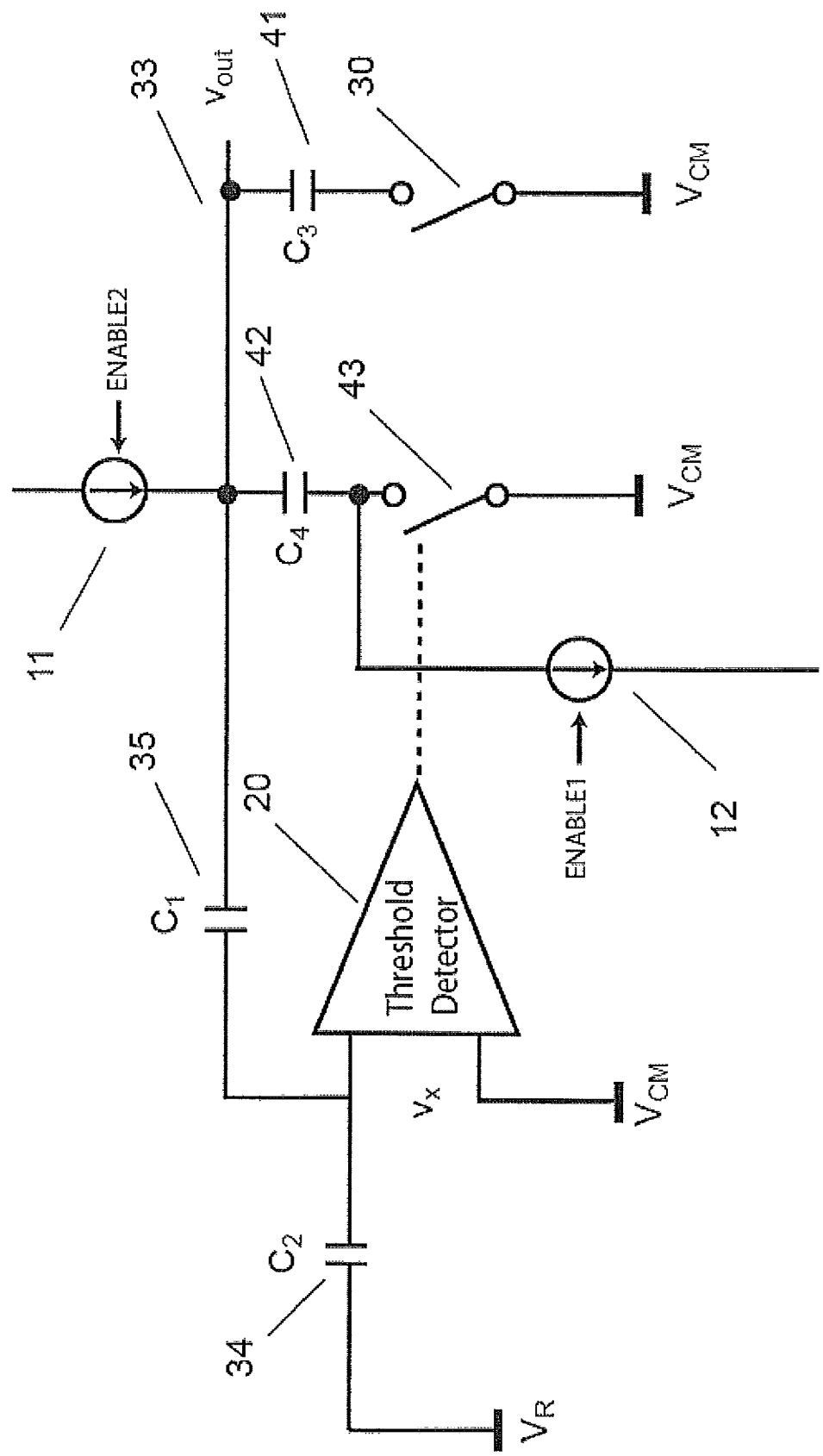
FIG. 4 illustrates an exemplary embodiment of the present invention.

The present invention reduces the voltage variation across the current source, and is applicable to both single-ended and fully-differential signal paths. It is applicable to two- or multi-phase threshold detector based circuits. For simplicity of explanation, only two phase embodiments are shown although the embodiments with multi-phase operation is straightforward. In the first embodiment of the present invention, the coarse output voltage at the end of the coarse phase is sampled on a capacitor and is placed in series with the current source during the subsequent fine phase. The first embodiment of the present invention employs a series capacitor 42 and a series capacitor sampling switch 43 shown in FIG. 4. The circuit configuration is shown during the charge-transfer phase of the switched-capacitor circuit. During the coarse phase, the coarse current source 11 is enabled and charges the capacitor network consisting of capacitors 34, 35, 41, and 42. The value of the current source 11 is chosen such that a fast up-ramp is obtained. Typically, the time allowed for the coarse phase is less than 50% of the half clock phase. When the threshold detector trips, the sampling switch 43 is turned OFF, and the current source 11 is also turned OFF. This causes the coarse output voltage to be sampled across the capacitor 42. Immediately after the coarse phase, the fine ramp current source 12 is enabled. This causes the output node 33 to ramp down, starting the fine phase. Alternatively, the threshold detector 43 is implemented with a dual or adjustable threshold, one for the coarse phase and the other for the fine phase. The coarse phase threshold can be made lower to reduce the coarse phase overshoot, or can be made smaller to produce a coarse phase undershoot such that the second phase ramp is in the same direction as the first ramp.

When threshold crossing is detected during the fine phase, the sampling switch 30 is turned off, locking the sampled charge on the next stage capacitor 41. The voltage across fine current source 12 always starts from the system common-mode voltage $V_{CM}$ and ends at the same voltage, which is proportional to the fine phase overshoot. Thus the voltage across the current source 12 varies only by a small amount and is not a function of the output voltage at node 33. Furthermore, the voltage across the current source 12 has the same waveform across it every time. Thus any error due to the finite resistance of the current source 12 is constant, only giving effectively input referred offset, improving the accuracy of the circuit substantially.

Figure 5:
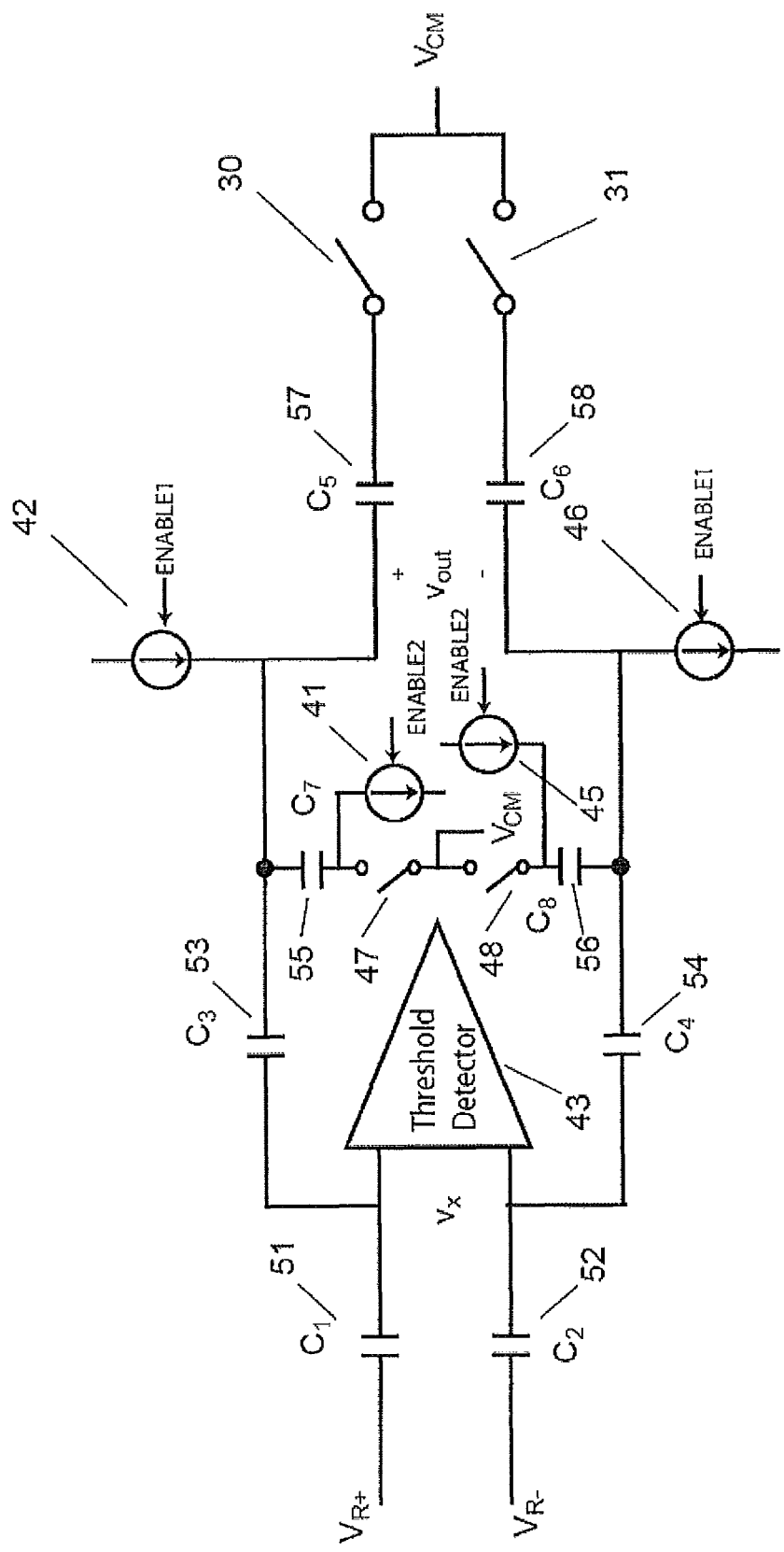
FIG. 5 illustrates a second embodiment of the present invention

The second embodiment of the present invention employs differential signal paths and series capacitors 55 and 56 and series capacitor sampling switches 47 and 48 shown in FIG. 5. The circuit configuration is shown during the charge-transfer phase of the switched-capacitor circuit. During the coarse phase, the current source 42 charges the capacitor network consisting of capacitors 51, 53, 55, and 57 and the current source 46 charges the capacitor network consisting of capacitors 52, 54, 56, and 58 in the opposite direction. The value of the current sources 42 and 46 is chosen such that a fast up-ramp is obtained. Typically, the time allowed for the coarse phase is less than 50% of the half clock phase. When the threshold detector trips, the sampling switches 47 and 48 are turned OFF and the coarse current sources 42 and 46 are also turned OFF. This causes the coarse output voltage to be sampled across the series capacitors 55 and 56. Immediately after the coarse phase, the fine current sources 41 and 45 are turned on. This causes the output voltage to ramp down, starting the fine phase. Alternatively, the threshold detector 43 is implemented with a dual or adjustable threshold, one for the coarse phase and the other for the fine phase. The coarse phase threshold can be made lower to reduce the coarse phase overshoot, or can be made smaller to produce a coarse phase undershoot such that the second phase ramp is in the same direction as the first ramp. When threshold crossing is detected during the fine phase, the sampling switches 30 and 31 are turned off, locking the sampled charge on the next stage capacitors 57 and 58. The voltage across fine current sources 41 and 45 always start from the system common-mode voltage $V_{CM}$ and ends at the same voltages, which are proportional to the fine phase overshoot. Thus the voltages across the sources 41 and 45 vary only by a small amount and are not a function of the output voltage $v_{out}$. Furthermore, the voltages across the sources 41 and 45 have the same waveform across it every time. Thus any error due to the finite resistance of the sources 41 and 45 is constant, only giving effectively input referred offset, improving the accuracy of the circuit substantially.

What is claimed is:

1. A switched-capacitor circuit, comprising:
    a threshold detector to generate a threshold detection signal when a difference between first and second input signals crosses a predetermined level;
    a switched capacitor network coupled to the threshold detector;
    a coarse current source coupled to the switched capacitor network, the coarse current source produces a coarse ramp;
    a fine current source coupled to the switched capacitor network, the fine current source produces a fine ramp;
    a series capacitor coupled to the fine current source; and
    a series sampling switch coupled to the series capacitor and the threshold detector, the series sampling switch samples a coarse output voltage of the switched capacitor network when the threshold detector indicates first threshold crossing.

2. The switched-capacitor circuit as claimed in claim 1, wherein the predetermined level is zero.

3. The switched-capacitor circuit as claimed in claim 1, wherein the threshold detector is a zero-crossing detector.

4. The switched-capacitor circuit as claimed in claim 1, wherein the threshold detector is a comparator.

5. The switched-capacitor circuit as claimed in claim 1, wherein the threshold detection signal is adjustable.

6. The switched-capacitor circuit as claimed in claim 1, wherein the threshold detector generates a dual threshold detection signal.

7. The switched-capacitor circuit as claimed in claim 1, further including an output sampling capacitor and an output sampling switch, the output sampling switch turns OFF when the threshold detector indicates a second threshold crossing.

8. A differential switched-capacitor circuit, comprising:
a threshold detector to generate a threshold detection signal when a difference between first and second input signals crosses a predetermined level;
a switched capacitor network coupled to the threshold detector;
a coarse current source, coupled to the switched capacitor network, the coarse current source produces a coarse ramp;
a fine current source, coupled to the switched capacitor network, the fine current source produces a fine ramp;
a series capacitor coupled to the fine current source; and
a series sampling switch coupled to the series capacitor and the threshold detector, the series sampling switch samples a coarse output voltage of the switched capacitor network when the threshold detector indicates first threshold crossing.

9. The differential switched-capacitor circuit as claimed in claim 8, wherein the predetermined level is zero.

10. The differential switched-capacitor circuit as claimed in claim 8, wherein the threshold detector is a zero-crossing detector.

11. The differential switched-capacitor circuit as claimed in claim 8, wherein the threshold detector is a comparator.

12. The differential switched-capacitor circuit as claimed in claim 8, wherein the threshold detection signal is adjustable.

13. The differential switched-capacitor circuit as claimed in claim 8, wherein the threshold detector generates a dual threshold detection signal.

14. The differential switched-capacitor circuit as claimed in claim 8, further including an output sampling capacitor and an output sampling switch, the sampling switch turns OFF when the threshold detector indicates a second threshold crossing.

15. A method for reducing the effect of finite output resistance of a current source in a threshold detector based circuit, the method comprising:
charging a switched capacitor network with a coarse current source;
sampling a coarse output voltage of the switched capacitor network on a series capacitor when the threshold detector indicates a crossing of a predetermined threshold;
connecting the series capacitor in series with a fine current source; and
charging the switched capacitor network with the fine current source.

16. A method for reducing the effect of finite output resistance of a current source in a differential threshold detector based circuit, the method comprising:
charging a differential switched capacitor network with coarse current sources;
sampling a coarse output voltage of the switched capacitor network on a series capacitor when a threshold detector indicates a crossing of a predetermined threshold;
connecting the series capacitor in series with fine current sources; and
charging the switched capacitor network with the fine current sources.

* * * * *